United States Patent
Hu

(10) Patent No.: US 11,586,118 B2
(45) Date of Patent: Feb. 21, 2023

(54) ALIGNMENT MARK EVALUATION METHOD AND ALIGNMENT MARK EVALUATION SYSTEM

(71) Applicant: CHANGXIN MEMORY TECHNOLOGIES, INC., Hefei (CN)

(72) Inventor: Liyuan Hu, Hefei (CN)

(73) Assignee: GHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/604,480

(22) PCT Filed: Jun. 30, 2021

(86) PCT No.: PCT/CN2021/103839
§ 371 (c)(1),
(2) Date: Oct. 18, 2021

(87) PCT Pub. No.: WO2022/052598
PCT Pub. Date: Mar. 17, 2022

(65) Prior Publication Data
US 2022/0291599 A1    Sep. 15, 2022

(30) Foreign Application Priority Data
Sep. 11, 2020 (CN) .......................... 202010954861.9

(51) Int. Cl.
G03F 9/00       (2006.01)
H01L 21/677     (2006.01)
H01L 21/68      (2006.01)
H01L 23/544     (2006.01)

(52) U.S. Cl.
CPC .......... *G03F 9/7088* (2013.01); *G03F 9/7046* (2013.01); *G03F 9/7073* (2013.01);
(Continued)

(58) Field of Classification Search
CPC . H01L 21/67; H01L 21/677; H01L 21/67704; H01L 21/68; H01L 21/681;
(Continued)

(56) References Cited

U.S. PATENT DOCUMENTS 8,187,897 B2 * 5/2012 Cohn ................ H01L 21/76807
257/E23.179
9,054,112 B2     6/2015 Lehr
(Continued)

FOREIGN PATENT DOCUMENTS

CN       1530752 A    9/2004
CN     101266411 A    9/2008
(Continued)

OTHER PUBLICATIONS

International Search Report and English Translation cited in PCT/CN2021/103839 dated Sep. 1, 2021, 11 pages.
(Continued)

*Primary Examiner* — Gordon J Stock, Jr.
(74) *Attorney, Agent, or Firm* — Cooper Legal Group, LLC

(57) ABSTRACT

Embodiments of the present disclosure provide an alignment mark evaluation method and an alignment mark evaluation system. The alignment mark evaluation method includes: setting a process step code of a wafer with an alignment mark to be evaluated as an evaluation code; obtaining a current process step code of the wafer; if it is detected that the current process step code is the evaluation code, switching a step to be executed to an alignment mark evaluation step; and executing the alignment mark evaluation step to evaluate the alignment mark to be evaluated.

7 Claims, 1 Drawing Sheet

(52) U.S. Cl.
CPC ...... *G03F 9/7092* (2013.01); *H01L 21/67703* (2013.01); *H01L 21/68* (2013.01); *H01L 23/544* (2013.01); *H01L 2223/54426* (2013.01)

(58) Field of Classification Search
CPC ................ H01L 21/682; H01L 23/544; H01L 2224/54426; G03F 9/70; G03F 9/7003; G03F 9/7007; G03F 9/7011; G03F 9/7015; G03F 9/7019; G03F 9/7023; G03F 9/7026; G03F 9/703; G03F 9/7034; G03F 9/7038; G03F 9/7042; G03F 9/7046; G03F 9/7049; G03F 9/7053; G03F 9/7069; G03F 9/7073; G03F 9/7076; G03F 9/708; G03F 9/7084; G03F 9/7088; G03F 9/7092
See application file for complete search history.

(56) References Cited

U.S. PATENT DOCUMENTS

| | | | |
|---|---|---|---|
| 2005/0240895 | A1 | 10/2005 | Smith et al. |
| 2007/0081161 | A1 | 4/2007 | Matsumoto |
| 2012/0244459 | A1 | 9/2012 | Chou et al. |
| 2021/0325790 | A1* | 10/2021 | Wang .................. G03F 7/70683 |

FOREIGN PATENT DOCUMENTS

| | | | | | |
|---|---|---|---|---|---|
| CN | 102655138 | A | | 9/2012 | |
| CN | 102692830 | A | | 9/2012 | |
| CN | 107305321 | A | | 10/2017 | |
| CN | 109556509 | A | | 4/2019 | |
| CN | 209400858 | U | | 9/2019 | |
| CN | 111007703 | A | | 4/2020 | |
| JP | H04223326 | A | | 8/1992 | |
| JP | 2000081712 | A | * | 3/2000 | ......... G03F 7/70633 |
| TW | 200418122 | A | * | 9/2004 | |
| TW | 200418122 | A | | 9/2004 | |
| WO | WO-2020166549 | A1 | * | 8/2020 | ........... G06K 7/1417 |

OTHER PUBLICATIONS

Written Opinion and English Translation cited in PCT/CN2021/103839 dated Sep. 1, 2021, 6 pages.
First Office Action cited in CN202010954861.9 dated Jun. 24, 2022, 13 pages.

* cited by examiner

ALIGNMENT MARK EVALUATION METHOD AND ALIGNMENT MARK EVALUATION SYSTEM

CROSS-REFERENCE TO RELATED APPLICATIONS

The present disclosure claims the priority to Chinese Patent Application 202010954861.9, titled "ALIGNMENT MARK EVALUATION METHOD AND ALIGNMENT MARK EVALUATION SYSTEM", field to the CNIPA on Sep. 11, 2020, which is incorporated herein by reference in its entirety.

TECHNICAL FIELD

Embodiments of the present disclosure relate to, but are not limited to, an alignment mark evaluation method and an alignment mark evaluation system.

BACKGROUND

An appropriate light source and an appropriate alignment mark are required during exposure. The quality of an alignment mark signal determines whether a wafer can be normally exposed, as well as exposure accuracy and exposure stability. When new products are developed, optimal alignment marks need to be selected from optional alignment marks, so as to improve the exposure stability between different wafers in the same lot and between different wafer lots.

SUMMARY

The following is the summary of subject matters detailed in the present disclosure. The summary is not intended to limit the protection scope of the claims.

Embodiments of the present disclosure provide an alignment mark evaluation method and an alignment mark evaluation system, which are beneficial to improving the evaluation efficiency of an alignment mark.

An embodiment of the present disclosure provides an alignment mark evaluation method, including: setting a process step code of a wafer with an alignment mark to be evaluated as an evaluation code; obtaining a current process step code of the wafer; if it is detected that the current process step code is the evaluation code, switching a step to be executed to an alignment mark evaluation step; and executing the alignment mark evaluation step to evaluate the alignment mark to be evaluated.

According to some embodiments of the present disclosure, setting the evaluation code includes: setting a process step code of a wafer lot including a plurality of wafers as the evaluation code, the wafer lot having the alignment mark to be evaluated; obtaining the current process step code includes: obtaining the current process step code of the wafer lot. In this way, the stability of alignment marks of different wafers in the same lot can be obtained by analyzing the evaluation data.

According to some embodiments of the present disclosure, the wafer has a plurality of the alignment marks to be evaluated; evaluating the alignment marks to be evaluated includes: evaluating each of the alignment marks to be evaluated. In this way, evaluation data of the plurality of alignment marks can be obtained at the same time.

According to some embodiments of the present disclosure, before the executing the alignment mark evaluation step, the method further includes: setting a mask code as a virtual mask code to skip a photomask loading step; wherein the mask code is configured to specify a photomask to be loaded, and the virtual mask code does not specify the photomask. In this way, the mask may not be provided when the alignment mark is evaluated, which can reduce the total steps of the evaluation method, avoid damage to the mask, and prolong the service life of the mask.

According to some embodiments of the present disclosure, the alignment mark evaluation method further includes: setting a first mask code of the wafer as the virtual mask code; the setting a mask code as a virtual mask code includes: reading the first mask code to set a second mask code for specifying a photomask as the virtual mask code. As such, the second mask code can be virtualized by adjusting the first mask code of the wafer.

According to some embodiments of the present disclosure, the alignment mark evaluation method further includes: establishing a dynamic path connecting the wafer and a machine, the machine being configured to obtain the process step code and execute the alignment mark evaluation step; and controlling the wafer to be transferred along the dynamic path after establishing the dynamic path.

According to some embodiments of the present disclosure, after the evaluation, the wafer is controlled to be transferred to a next machine along the dynamic path; the method further includes: obtaining the current process step code of the wafer, and transferring the wafer if the current process step code is the evaluation code.

Correspondingly, an embodiment of the present disclosure further provides an alignment mark evaluation system, including: a compiling module, configured to set a process step code of a wafer with an alignment mark to be evaluated as an evaluation code; and a process machine, configured to obtain a current process step code of the wafer, switch a step to be executed to an alignment mark evaluation step if it is detected that the current process step code is the evaluation code, and execute the alignment mark evaluation step to evaluate the alignment mark to be evaluated.

According to some embodiments of the present disclosure, the alignment mark evaluation system further includes: a wafer lot, the wafer lot including a plurality of wafers; the compiling module is further configured to set a process step code of the wafer lot as an evaluation code; the process machine is further configured to obtain a current process step code of the wafer lot.

According to some embodiments of the present disclosure, the process machine is further configured to set a mask code as a virtual mask code to skip a photomask loading step; wherein the mask code is configured to specify a photomask to be loaded, and the virtual mask code does not specify the photomask.

According to some embodiments of the present disclosure, the alignment mark evaluation system further includes: a management module, configured to establish a dynamic path connecting the wafer and the process machine, and also configured to control the wafer to be transferred along the dynamic path.

According to some embodiments of the present disclosure, the alignment mark evaluation system further includes: a process matching machine, the process matching machine being located behind the process machine in the transfer direction of the wafer; the process matching machine is configured to obtain the current process step code of the wafer, and is also configured to transfer the wafer when the current process step code is the evaluation code.

According to some embodiments of the present disclosure, the process machine includes an exposure machine; and the process matching machine includes a developer.

Compared with the prior art, the technical solutions provided by the embodiments of the present disclosure have the following advantages:

In the above technical solutions, a step code of a specific wafer is adjusted, and the alignment mark evaluation step can be automatically enabled by identifying the step code of the wafer. As such, the alignment mark evaluation step can be remotely operated, and the alignment mark evaluation step and other parallel steps can be switched, without a special machine for the alignment mark evaluation step, which is beneficial to improving the evaluation efficiency of the alignment mark.

Other aspects will be apparent upon reading and understanding the accompanying drawings and detailed descriptions.

BRIEF DESCRIPTION OF THE DRAWINGS

The accompanying drawings incorporated into the description and constituting a part of the description illustrate the embodiments of the present disclosure, and are used together with the description to explain the principles of the embodiments of the present disclosure. In these drawings, similar reference numerals are used to indicate similar elements. The drawings in the following description are some embodiments of the present disclosure, but not all embodiments. For those skilled in the art, other drawings can be obtained from these drawings without any creative efforts.

REFERENCE NUMERALS

201: wafer; 202: compiling module; 203: management module; 204: process machine; 205: process matching machine.

DETAILED DESCRIPTION

In order to make the objectives, technical solutions and advantages of the embodiments of the present disclosure clearer, the embodiments of the present disclosure will be described in detail below with reference to the accompanying drawings. However, those skilled in the art can understand that, in each embodiment of the present disclosure, many technical details are proposed in order to enable a reader to better understand the present disclosure. However, the technical solutions of the present disclosure can also be implemented without these technical details and various variations and modifications based on the following embodiments.

Figure 1:
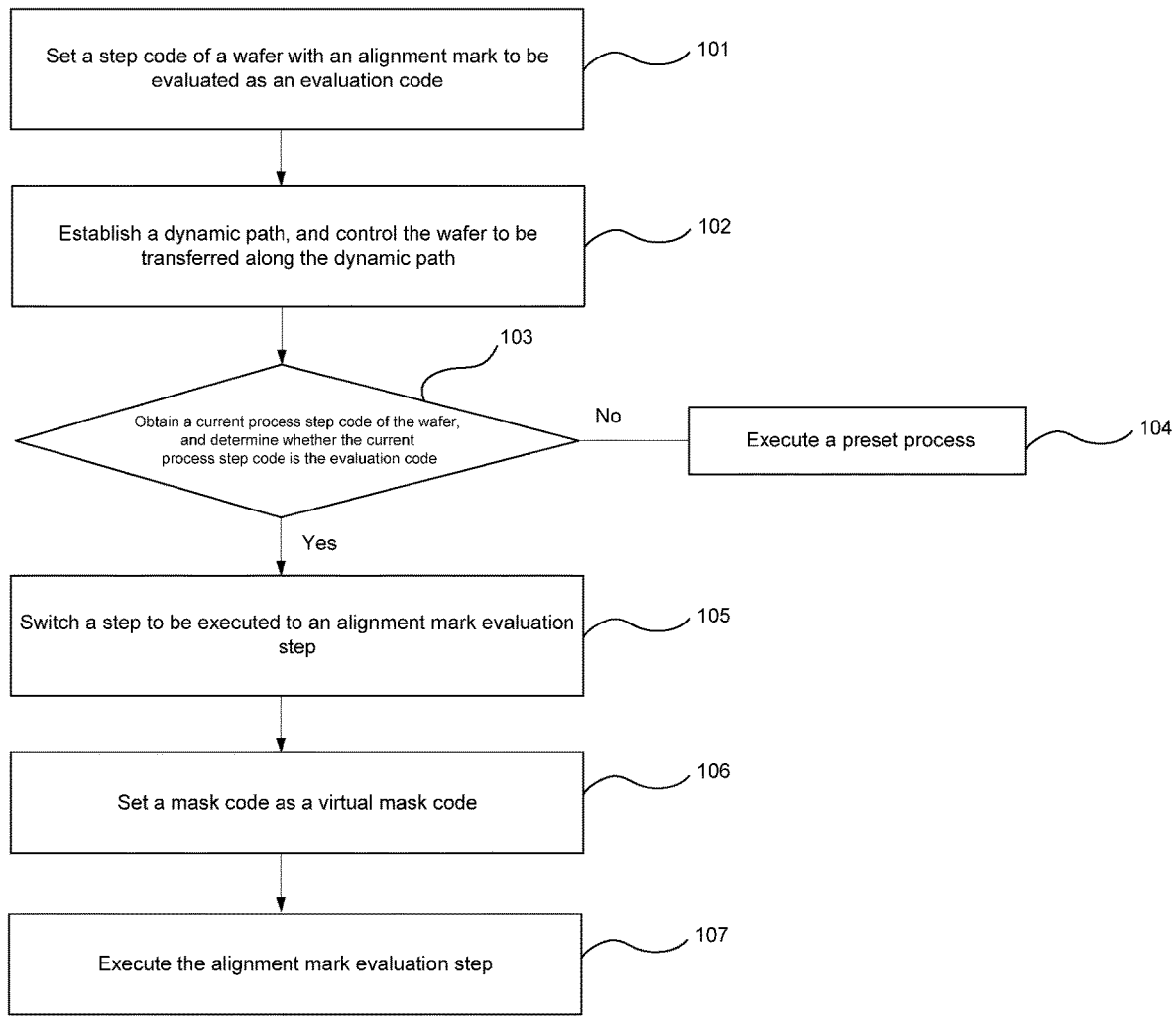
FIG. 1 is a schematic flowchart of an alignment mark evaluation method provided by an embodiment of the present disclosure.

FIG. 1 is a schematic flowchart of an alignment mark evaluation method provided by an embodiment of the present disclosure. Referring to FIG. 1, the alignment mark evaluation method includes:

Step 101: a step code of a wafer with an alignment mark to be evaluated is set as an evaluation code.

In some embodiments of the present disclosure, the wafer has an alignment mark, the information directory of the wafer includes the attribute column "process step code", the text information corresponding to the attribute column of the process step code includes an evaluation code or a process code, the evaluation code is used to characterize that the wafer requires an alignment mark evaluation, and the process code is used to characterize that the wafer requires a preset process.

The evaluation code may be a specific character string, such as /MONITOR/ALE, and the process code may also be a specific character string, such as /DBRMA/ART01.

When a plurality of wafers are transferred one by one on a preset track for a preset process, a process step code(s) of one or more of the wafers may be individually set, thus obtaining the accuracy of an alignment mark of a single wafer and the stability of alignment marks between different wafers; when wafers are transferred on a preset track in the form of wafer lots, a process step code(s) of one or more wafer lots may be set to perform an alignment mark evaluation step on all wafers of the wafer lot(s), thus obtaining the repeatability of alignment marks of different wafers in a single wafer lot and the stability of alignment marks between different wafer lots by analyzing evaluation data.

A wafer usually has a plurality of alignment marks, and the alignment marks may include one or more alignment marks to be evaluated. When the alignment marks are subsequently evaluated, each alignment mark to be evaluated is evaluated to obtain original signal data of each alignment mark to be evaluated, and then an optimal alignment mark is screened out. This is advantageous to further improve the evaluation efficiency of the alignment mark to be evaluated.

Step 102: a dynamic path is established, and the wafer is controlled to be transferred along the dynamic path.

The dynamic path is used to connect a wafer position and a machine position, so that the wafer or wafer lot can be transferred to the preset machine position, wherein the machine is configured to obtain a current process step code of the wafer or wafer lot and execute an alignment mark evaluation step. The machine for the alignment mark evaluation step may be either a special machine only used to execute this step, or any machine that is idle or about to be idle and can execute this step. The latter option can increase the utilization of the machine and increase the uptime of the machine, thereby increasing the output.

The machine includes a process machine, the process machine refers to a machine that can perform a preset process, and the process machine includes an exposure machine.

After the dynamic path is established, both wafers with alignment marks to be evaluated and wafers without alignment marks to be evaluated can be controlled to be transferred along the dynamic path. This can reduce the difficulty in establishing the dynamic path, improve the utilization of the wafer transfer path, and quickly implement the evaluation step for alignment marks.

Step 103: a current process step code of the wafer is obtained.

In some embodiments of the present disclosure, after the wafer or wafer lot is transferred to a detection range or a process range of the machine, the machine obtains the current process step code of the wafer by reading an information directory of the wafer or wafer lot. The detection range refers to a position range where the machine can read information, the process range refers to a position range where the wafer or wafer lot should be located for the preset process or the alignment mark evaluation step, and the process range is usually smaller than the detection range.

The machine adjusts a step to be executed according to the read current process step code. When the current process step code is the evaluation code, step 105 is executed; when the current process step code is the process code, step 104 is executed.

The preset process is related to the specific type of the machine executing the alignment mark evaluation step. For example, when the machine executing the alignment mark evaluation step is an exposure machine, the preset process is exposure.

Step 105: a step to be executed is switched to an alignment mark evaluation step.

When the current process step code of the wafer is the evaluation code, the step to be executed may be switched from the preset process to the alignment mark evaluation step, or the step to be executed may be switched from a first alignment mark evaluation step to a second alignment mark evaluation step, and the difference between the first alignment mark evaluation step and the second alignment mark evaluation step lies in different alignment marks to be evaluated.

The alignment mark evaluation step is used to obtain evaluation data of the alignment mark to be evaluated, the evaluation data including the accuracy of the alignment mark to be evaluated. After evaluation data of a plurality of different alignment marks to be evaluated in the same scenario is obtained, alignment marks with relatively high accuracy may be selected as alignment marks actually applied to the scenario. In addition, after multiple evaluations on the different alignment marks to be evaluated in the same scenario, alignment marks with better stability may be selected as alignment marks actually applied to the scenario.

In addition, when the wafer has a plurality of alignment marks, the method of obtaining the alignment mark to be evaluated includes: first evaluating all the alignment marks, and then screening evaluation data of the alignment mark to be evaluated from the obtained evaluation data; or, first locating the alignment mark to be evaluated, and then evaluating the alignment mark to be evaluated.

Step 106: a mask code is set as a virtual mask code.

After the machine detects the evaluation code, the step to be executed is switched to the alignment mark evaluation step instead of the preset process, so a specified mask is no longer required, that is, a mask is no longer called to limit the process range of the machine.

When the machine is an exposure machine, the mask is a photomask, and the photomask is used to limit the range of light irradiated on the wafer.

The mask code is used to specify a photomask to be loaded, while the virtual mask code does not specify the photomask. After the mask code is set as the virtual mask code, a photomask calling step can be skipped. In this way, the mask may not be provided when the alignment mark is evaluated, which can reduce the total steps of the evaluation method, avoid damage to the mask, and prolong the service life of the mask.

The information directory of the wafer or wafer lot includes an attribute column "first mask code", which is used to indicate a photomask required for the wafer or wafer lot; the machine has an attribute column "second mask code", which is used to specify a photomask to be loaded; and the machine can call the specified photomask by reading text information of the first mask code and setting the text information of the first mask code as text information of the second mask code.

The step of calling the photomask is not necessarily performed by the machine, but can also be performed by other control module. That is, the control module reads the second mask code of the machine and calls the specified photomask according to the second mask code.

Since the photomask does not need to be called when the wafer with the alignment mark to be evaluated is evaluated, the first mask code may be set as a virtual mask code, and the second mask code identical to the first mask code is also a virtual mask code, thus skipping the step of calling the photomask; or, after the machine reads the first mask code, the machine can directly account for the machine, that is, directly adjust the second mask code to a virtual mask code, thus skipping the step of calling the photomask.

In the case of directly accounting for the machine, regardless of whether the first mask code is a virtual mask code or a valid mask code specifying a specific mask, the second mask code can be set as a virtual mask code. In this way, when the process step code of the wafer or wafer lot is set as the evaluation code, and the first mask code is not adjusted to the virtual mask code, the step of calling the mask can be skipped.

Step 107: the alignment mark evaluation step is executed.

Since the wafer or wafer lot is only used for the alignment mark evaluation step at this time, the process machine used to execute the alignment mark evaluation step does not need to execute the preset process, and the matching process machine matching the process machine also does not need to execute the preset matching process step, and the both are only used for the wafer or wafer lot transfer step.

The process machine may be an exposure machine, and the matching process machine may be a developer. On the transfer path of the wafer or wafer lot, after the wafer or wafer lot completes the alignment mark evaluation step at the process machine, the developer obtains the current process step code of the wafer. If the current process step code is the evaluation code, the developer does not execute, but is only used to transfer the wafer or wafer lot.

In some embodiments of the present disclosure, a step code of a specific wafer is adjusted, and the alignment mark evaluation step can be automatically enabled by identifying the step code of the wafer. As such, the alignment mark evaluation step can be remotely operated, and the alignment mark evaluation step and other parallel steps can be switched, without a special machine for the alignment mark evaluation step, which is beneficial to improving the evaluation efficiency of the alignment mark.

Correspondingly, an embodiment of the present disclosure further provides an alignment mark evaluation system, which can be used to execute the above alignment mark evaluation method.

Figure 2:
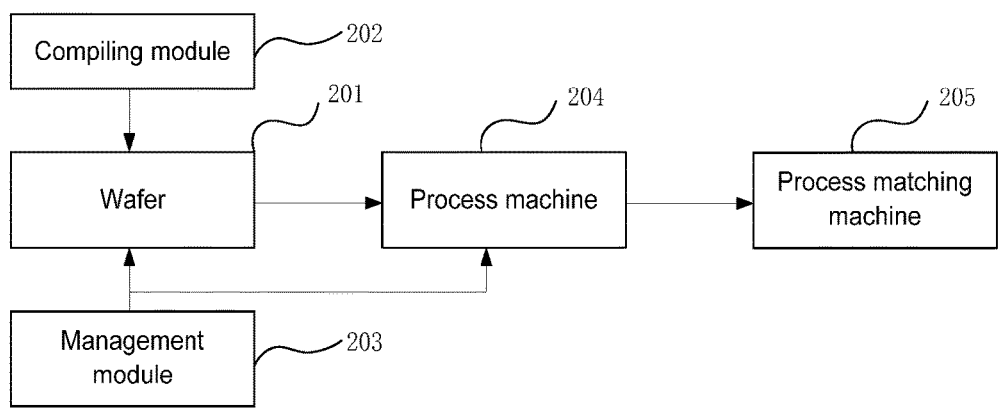
FIG. 2 is a schematic distribution diagram of an alignment mark evaluation system provided by an embodiment of the present disclosure.

Referring to FIG. 2, the alignment mark evaluation system includes: a compiling module 202, configured to set a process step code of a wafer 201 with an alignment mark to be evaluated as an evaluation code; and a process machine 204, configured to obtain a current process step code of the wafer 201, switch a step to be executed to an alignment mark evaluation step if it is detected that the current process step code is the evaluation code, and execute the alignment mark evaluation step to evaluate the alignment mark to be evaluated.

The wafer 201 may be a single wafer or a wafer lot, and the wafer lot includes a plurality of wafers; the compiling module 202 is further configured to set a process step code of the wafer lot as an evaluation code, and the process machine 204 is further configured to obtain a current process step code of the wafer lot.

The process machine 204 is further configured to set a mask code as a virtual mask code to skip a photomask loading step; wherein the mask code is configured to specify a photomask to be loaded, and the virtual mask code does not specify the photomask.

In some embodiments of the present disclosure, the alignment mark evaluation system further includes: a management module 203, configured to establish a dynamic path connecting the wafer 201 and the process machine 204, and also configured to control the wafer 201 to be transferred along the dynamic path.

The alignment mark evaluation system further includes: a process matching machine 205, the process matching machine 205 being located behind the process machine 204 in the transfer direction of the wafer 204; the process matching machine 205 is configured to obtain a current process step code of the wafer 201, and suspend the execution of a preset process when the current process step code is the evaluation code.

The process machine includes an exposure machine; and the process matching machine includes a developer.

In some embodiments of the present disclosure, an alignment mark evaluation system is provided. A step code of a specific wafer is adjusted, and the alignment mark evaluation step can be automatically enabled by identifying the step code of the wafer. As such, the alignment mark evaluation step can be remotely operated, and the alignment mark evaluation step and other parallel steps can be switched, without a special machine for the alignment mark evaluation step, which is beneficial to improving the evaluation efficiency of the alignment mark.

A person skilled in the art would easily conceive of other embodiments of the present disclosure after considering the disclosure of the description and practice. The present disclosure is intended to cover any variations, uses or adaptive changes of the present disclosure. These variations, uses or adaptive changes follow the general principle of the present disclosure and comprise common general knowledge or conventional technical means in the technical field that are not disclosed in the present disclosure. The description and the embodiments are merely regarded as exemplary, and the real scope and spirit of the present disclosure are pointed out by the following claims.

Those skilled in the art can understand that the foregoing embodiments are specific examples for implementing the present disclosure, and in actual applications, various changes may be made in form and details without departing from the spirit and scope of the present disclosure. Any person skilled in the art can make various changes and modifications without departing from the spirit and scope of the present disclosure. Therefore, the protection scope of the present disclosure shall be subject to the scope of the claims.

INDUSTRIAL APPLICABILITY

The embodiments of the present disclosure provide an alignment mark evaluation method and an alignment mark evaluation system. A step code of a specific wafer is adjusted, and the alignment mark evaluation step can be automatically enabled by identifying the step code of the wafer. As such, the alignment mark evaluation step can be remotely operated, and the alignment mark evaluation step and other parallel steps can be switched, without a special machine for the alignment mark evaluation step, which is beneficial to improving the evaluation efficiency of the alignment mark.

The invention claimed is:

1. An alignment mark evaluation method, wherein the alignment mark evaluation method comprises:
setting a process step code of a wafer with an alignment mark to be evaluated as an evaluation code;
obtaining a current process step code of the wafer;
when it is detected that the current process step code is the evaluation code, switching a step to be executed to an alignment mark evaluation step in which at least one of an accuracy of the alignment mark or a stability of the alignment mark is determined; and
executing the alignment mark evaluation step to evaluate the alignment mark to be evaluated.

2. The alignment mark evaluation method according to claim 1, wherein setting the evaluation code comprises: setting a process step code of a wafer lot comprising a plurality of wafers as the evaluation code, the wafer lot having the alignment mark to be evaluated; obtaining the current process step code comprises: obtaining the current process step code of the wafer lot.

3. The alignment mark evaluation method according to claim 1, wherein the wafer has a plurality of the alignment marks to be evaluated; evaluating the alignment marks to be evaluated comprises: evaluating each of the alignment marks to be evaluated.

4. The alignment mark evaluation method according to claim 1, wherein before the executing the alignment mark evaluation step, the method further comprises: setting a mask code as a virtual mask code to skip a photomask loading step; wherein the mask code is configured to specify a photomask to be loaded, and the virtual mask code does not specify the photomask.

5. The alignment mark evaluation method according to claim 4, wherein the alignment mark evaluation method further comprises: setting a first mask code of the wafer as the virtual mask code; the setting a mask code as a virtual mask code comprises: reading the first mask code to set a second mask code for specifying a photomask as the virtual mask code.

6. The alignment mark evaluation method according to claim 1, wherein the alignment mark evaluation method further comprises: establishing a dynamic path connecting the wafer and a machine; controlling the wafer to be transferred along the dynamic path after establishing the dynamic path; and executing the alignment mark evaluation step at the machine.

7. The alignment mark evaluation method according to claim 6, wherein after the evaluation, the wafer is controlled to be transferred to a next machine along the dynamic path; the method further comprises: obtaining the current process step code of the wafer, and transferring the wafer when the current process step code is the evaluation code.

\* \* \* \* \*

UNITED STATES PATENT AND TRADEMARK OFFICE
CERTIFICATE OF CORRECTION

| | |
|---|---|
| PATENT NO. | : 11,586,118 B2 |
| APPLICATION NO. | : 17/604480 |
| DATED | : February 21, 2023 |
| INVENTOR(S) | : Hu |

It is certified that error appears in the above-identified patent and that said Letters Patent is hereby corrected as shown below:

On the Title Page

Item (73) Please insert: --CHANGXIN MEMORY TECHNOLOGIES, INC., HEFEI (CN)--

Signed and Sealed this
Twenty-second Day of August, 2023

Katherine Kelly Vidal
*Director of the United States Patent and Trademark Office*